US007538008B2

(12) United States Patent
Feijoo et al.

(10) Patent No.: US 7,538,008 B2
(45) Date of Patent: May 26, 2009

(54) METHOD FOR PRODUCING A LAYER STRUCTURE

(75) Inventors: Diego Feijoo, Burghausen (DE); Guenter Schwab, Neuoetting (DE); Thomas Buschhardt, Burghausen (DE)

(73) Assignee: Siltronic AG, Munich (DE)

( * ) Notice: Subject to any disclaimer, the term of this patent is extended or adjusted under 35 U.S.C. 154(b) by 2 days.

(21) Appl. No.: 11/743,694

(22) Filed: May 3, 2007

(65) Prior Publication Data

US 2007/0259530 A1 Nov. 8, 2007

(30) Foreign Application Priority Data

May 4, 2006 (DE) .................. 10 2006 020 825

(51) Int. Cl.
*H01L 21/76* (2006.01)
(52) U.S. Cl. .............. 438/403; 438/770; 257/E21.32; 257/E21.321
(58) Field of Classification Search ......... 438/758, 438/759, 767, 400, 403, 455; 257/E21.32, 257/E21.321, E21.322, E21.324
See application file for complete search history.

(56) References Cited

U.S. PATENT DOCUMENTS

| 5,022,961 | A | 6/1991 | Izumi et al. |
| 6,008,128 | A | 12/1999 | Habuka et al. |
| 6,221,168 | B1 * | 4/2001 | Carter et al. .................. 134/1 |
| 6,630,024 | B2 | 10/2003 | Schmolke et al. |
| 6,962,859 | B2 * | 11/2005 | Todd et al. .................. 438/482 |
| 6,995,077 | B2 | 2/2006 | Siebert et al. |
| 7,060,632 | B2 * | 6/2006 | Fitzgerald et al. .......... 438/767 |
| 2003/0060020 | A1 | 3/2003 | Walitzki et al. |
| 2004/0020513 | A1 | 2/2004 | Bergman et al. |
| 2005/0104067 | A1 | 5/2005 | Chu et al. |
| 2005/0148161 | A1 | 7/2005 | Chen et al. |
| 2006/0138539 | A1 | 6/2006 | Stadler et al. |

FOREIGN PATENT DOCUMENTS

| DE | 10025871 A1 | 12/2001 |
| DE | 102004062355 A1 | 7/2006 |
| WO | 01 52309 A1 | 7/2001 |

* cited by examiner

*Primary Examiner*—Brook Kebede
(74) *Attorney, Agent, or Firm*—Brooks Kushman P.C.

(57) ABSTRACT

A layer structure comprising a smoothed interlayer and an overlying layer applied on the interlayer, wherein the interlayer is treated with a gaseous etchant containing hydrogen fluoride, a material removal being obtained thereby and the interlayer being smoothed.

11 Claims, No Drawings

METHOD FOR PRODUCING A LAYER STRUCTURE

BACKGROUND OF THE INVENTION

1. Field of the Invention

The invention relates to a method for producing a layer structure comprising a smoothed interlayer and an overlying layer applied on the interlayer. Layer structures of this type are produced for example as substrates for electronic, optoelectronic and microelectromechanical applications. The layers are for example deposited on a carrier by means of CVD methods or connected to the carrier by means of bonding methods. Representatives of such substrates are, for example, semiconductor wafers with a plurality of deposited or bonded layers, in particular SOI substrates (silicon on insulator), substrates with a layer of $Si_xGe_{1-x}$ (silicon-germanium) and a layer of strained silicon (strained silicon on bulk) and sSOI substrates (strained silicon on insulator).

2. Background Art

The application of the overlying layer to the interlayer constitutes a critical step because it necessarily requires the microroughness of the interlayer to be as low as possible. Various methods have been proposed, therefore, in order to meet this requirement. Thus, in accordance with US2005/0104067 an SGOI substrate (SiGe on insulator) is subjected to chemical mechanical polishing prior to the deposition of a layer of strained silicon, in order to achieve the necessary smoothing. In accordance with US2003/0060020, polishing is effected using a magnetorheological fluid (MRF) in order to reduce the microroughness further. What is disadvantageous about these methods is the outlay which they require. U.S. Pat. No. 6,995,077 describes a method which serves especially for smoothing semiconductor wafers composed of monocrystalline silicon prior to the deposition of an epitaxial layer, and comprises a treatment of the semiconductor wafer with a mixture of hydrogen and hydrogen chloride.

SUMMARY OF THE INVENTION

An object of the invention was to provide a method for producing a smooth interlayer surface or other surface which involves a lower outlay than known methods and is suitable for more than just smoothing surfaces composed of monocrystalline silicon prior to epitaxy. These and other objects are achieved by treating the interlayer with a gaseous etchant containing hydrogen fluoride.

DETAILED DESCRIPTION OF THE PREFERRED EMBODIMENT(S)

The invention thus relates to a method for producing a layer structure comprising a smoothed interlayer and an overlying layer applied on the smoothed interlayer, wherein the interlayer is treated with a gaseous etchant containing hydrogen fluoride, material removal being obtained thereby, and the interlayer being smoothed.

The method can be applied in particular to layer structures in which an interlayer to be smoothed comprises a material which includes monocrystalline silicon, polycrystalline silicon, silicon oxide, silicon-germanium, germanium, silicon carbide, III/V compound semiconductors and II/VI compound semiconductors. It is suitable in particular, for smoothing monocrystalline semiconductor wafers containing silicon onto which an epitaxial layer is to be deposited, for smoothing thin layers of monocrystalline silicon which are separated from a donor wafer after an ion implantation and are transferred to a substrate wafer in order to form an SOI wafer, for smoothing a "cross-hatch" on sSOI substrates prior to the deposition of a layer of strained silicon, or for smoothing interlayers or entire semiconductor wafers of polycrystalline silicon, silicon carbide, or of silicon dioxide, prior to bonding. Polycrystalline silicon is etched isotropically, in other words smoothed, independently of the orientation of the crystallites. The roughness of interlayers composed of silicon dioxide which arise as a result of thermal oxidation of silicon is generally lower than that of interlayers composed of silicon dioxide produced by the decomposition of TEOS (tetraethyl orthosilicate). Therefore, the application of the method for smoothing interlayers produced on a silicate basis is particularly advantageous.

The interlayer is treated with a gaseous etchant containing hydrogen fluoride in order to obtain the smoothing effect. Interlayers comprising silicon are oxidized beforehand or at the same time, in order that the hydrogen fluoride can dissolve and remove the oxide layer with formation of water. The oxidizing agent, if required, is passed to the interlayer before or together with the gaseous etchant. Ozone is particularly preferred as an oxidizing agent.

The smoothing treatment of the interlayer preferably takes place in a moist environment, in other words, in the presence of water. By way of example, water is sprayed onto the interlayer before the gaseous etchant is supplied. The oxidizing agent or the gaseous etchant or both can be enriched with water, for example by passing these substances through water before they reach the interlayer. Instead of pure water, ozone-containing water may also be sprayed onto the interlayer.

The gaseous etchant may also contain, in addition to hydrogen fluoride, one or more further substances, for example nitrogen having the function of carrier gas, water vapor, or ozone. It is also possible to add additives such as isopropanol, which intensify the wetting of the surface of the interlayer. A reactor that is suitable for the smoothing treatment of the interlayer is described, for example, in US2004/0020513 A1.

The smoothing treatment of the interlayer is preferably performed at a temperature of 20° C. to 70° C. A temperature range of 30° C. to 70° C. is particularly preferred because at lower temperatures, smoothing takes place too slowly and at higher temperatures, no smoothing effect arises; rather the roughness of the processed side increases. A temperature of about 40° C. is optimal.

The smoothing treatment of the interlayer is preferably repeated a number of times, for example 1 to 5 times, most preferably 1 to 2 times. It is also expedient to rinse the interlayer with water after each repetition of the smoothing treatment.

As a result of the application of the method of the invention, the roughness of the interlayer preferably decreases to less than 5 Å RMS, measured by AFM on a measurement area of 40×40 µm$^2$, more preferably to less than 2 Å RMS. The material removal obtained by means of the smoothing treatment of the interlayer amounts to preferably no more than 0.5 µm, more preferably 0.1 to 0.2 µm.

After the smoothing treatment, a further layer is applied to the interlayer. This is done for example by deposition, in particular CVD deposition, or by bonding.

EXAMPLE

A 4 µm thick SiGe layer is deposited epitaxially on a 300 mm silicon substrate, the concentration of germanium being increased from 0 to 20% over the thickness of the layer. The roughness of the layer exhibits an RMS value of 100 Å as measured by AFM with a zone of 40×40 µm$^2$. The epitaxially coated substrate is subsequently smoothed by treatment by means of the inventive method. For this purpose, the substrate is sprayed with water at 40° C. in an etching chamber and subsequently etched by means of HF gas and ozone. After treatment twice with this cycle, the substrate is sprayed with water again and spun dry. In this case, 0.2 μm is removed overall from the SiGe layer. An AFM measurement with a zone of 40×40 μm² shows an improvement in the RMS roughness to 3 Å.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for producing a layer structure comprising a carrier and a smoothed interlayer thereon, and an overlying layer applied onto the interlayer, said interlaver comprising monocrystalline silicon, polycrystalline silicon, silicon-germanium, or germanium, comprising treating the interlayer at a temperature of from about 20° C. to 70° C. with an oxidizing agent and with a gaseous etchant containing hydrogen fluoride, such that no more than about 0.5μm of material is removed and the interlayer being smoothed thereby.

2. The method of claim 1, wherein the interlayer is treated at a temperature of from about 30° C. to 70° C.

3. The method of claim 1, wherein material removal is in the range of 0.1μm to 0.2μm.

4. The method of claim 1, wherein the gaseous etchant contains the oxidizing agent.

5. The method of claim 1, wherein the gaseous etchant further contains isopropanol.

6. The method of claim 1, wherein the gaseous etchant further contains water.

7. The method of claim 1, wherein the interlayer is smoothed to a roughness of less than 5ÅRMS.

8. The method of claim 1, wherein the overlying layer is bonded onto the interlayer.

9. The method of claim 1, wherein the overlying layer is deposited onto the interlayer.

10. The method of claim 1, wherein the gaseous etchant contains ozone.

11. The method of claim 1, wherein the gaseous etchant contains nitrogen.

* * * * *